(12) United States Patent
Ivkov et al.

(10) Patent No.: US 10,034,404 B2
(45) Date of Patent: Jul. 24, 2018

(54) INTERCHANGEABLE PANEL OR PLATE FOR SERVER CASE

(71) Applicant: CentrifyHealth, LLC, Nashville, TN (US)

(72) Inventors: Kimberly K. Ivkov, Nashville, TN (US); Frank J. Convertino, Nashville, TN (US); Sean M. Galyen, Nashville, TN (US); Andrew B. Spitzer, Nashville, TN (US)

(73) Assignee: CentrifyHealth, LLC, Nashville, TN (US)

( * ) Notice: Subject to any disclaimer, the term of this patent is extended or adjusted under 35 U.S.C. 154(b) by 0 days.

(21) Appl. No.: 14/937,354

(22) Filed: Nov. 10, 2015

(65) Prior Publication Data

US 2016/0135312 A1    May 12, 2016

Related U.S. Application Data

(60) Provisional application No. 62/077,362, filed on Nov. 10, 2014.

(51) Int. Cl.
*A47B 81/00* (2006.01)
*H05K 7/14* (2006.01)

(52) U.S. Cl.
CPC .................. *H05K 7/1487* (2013.01)

(58) Field of Classification Search
CPC ..................................................... G06F 1/181
USPC .......................................... 312/223.1, 223.2
See application file for complete search history.

(56) References Cited

U.S. PATENT DOCUMENTS

| | | | |
|---|---|---|---|
| 3,961,721 A | 6/1976 | Gordon et al. | |
| 5,975,659 A * | 11/1999 | Yang | G06F 1/181 312/223.2 |
| 6,288,333 B1 * | 9/2001 | Liu | G06F 1/18 174/563 |
| 6,671,179 B2 * | 12/2003 | Chen | G06F 1/181 190/116 |
| 6,738,255 B2 * | 5/2004 | Chen | G06F 1/181 312/223.2 |
| 7,208,686 B1 * | 4/2007 | Chen | G06F 1/181 174/559 |
| 7,377,602 B2 * | 5/2008 | Chen | G06F 1/181 292/121 |

(Continued)

OTHER PUBLICATIONS

Oxford Living Dictionaries "edge" definition, Aug. 21, 2017.*

(Continued)

*Primary Examiner* — Matthew W Ing
(74) *Attorney, Agent, or Firm* — Alston & Bird LLP (57) ABSTRACT

A server case, chassis, or enclosure with an easily removable front panel or plate. The outside or front of the front panel may be decorated with a logo, trademark, or other design, and thus be used by a vendor supplying a server case, with or without a computer or computer apparatus installed, as a means of decorating, identifying, or branding the case or contents, or both. The panels or plates may be interchangeable. Panels or plates may be attached to the case by means of tabs with magnets extending from the sides of the panel or plate and fitting within corresponding slots in the front of the case, thereby providing a secure attachment that prevents lateral movement, but is easily removable by hand without tools.

10 Claims, 13 Drawing Sheets

(56) References Cited

U.S. PATENT DOCUMENTS

| | | | | |
|---|---|---|---|---|
| 8,247,690 | B2* | 8/2012 | Wang | G06F 1/181 |
| | | | | 174/50 |
| 9,402,473 | B2* | 8/2016 | Cottrell | A47B 13/021 |
| 2005/0057127 | A1* | 3/2005 | Chen | G06F 1/181 |
| | | | | 312/223.2 |
| 2007/0253171 | A1 | 11/2007 | Cheng et al. | |
| 2008/0178991 | A1 | 7/2008 | Mah et al. | |
| 2009/0127988 | A1 | 5/2009 | Lucuks et al. | |
| 2011/0290553 | A1 | 12/2011 | Behrens et al. | |
| 2013/0271722 | A1* | 10/2013 | DiChiara | G02C 1/02 |
| | | | | 351/140 |
| 2014/0218412 | A1 | 8/2014 | Hwangbo et al. | |

OTHER PUBLICATIONS

International Search Report and Written Opinion of the International Searching Authority for International Patent Application No. PCT/US2015/059941 dated May 26, 2016, 10 pages.

* cited by examiner

INTERCHANGEABLE PANEL OR PLATE FOR SERVER CASE

This application claims benefit of and priority to U.S. Provisional Application No. 62/077,362, filed Nov. 10, 2014, and is entitled to that filing date for priority. The specification, figures and complete disclosure of U.S. Provisional Application No. 62/077,362 are incorporated herein by specific reference for all purposes.

FIELD OF INVENTION

This invention relates to a computer server case with an interchangeable, replaceable front panel with logos.

SUMMARY OF INVENTION

In various embodiments, the present invention comprises a server case, chassis, or enclosure with an easily removable front panel or plate. The outside (or front) of the front panel may be decorated with a logo, trademark, or other design, and thus be used by a vendor supplying a server case, with or without a computer or computer apparatus installed, as a means of decorating, identifying, or branding the case or contents, or both. In several embodiments, the panel also serves as a front cover for the server chassis or case, although the front panel or plate also may be placed on the front cover of the server chassis or case.

The front panels may come in a variety of configurations, designed to fit onto a variety of server cases. The server case generally comprises a flat front, with or without an opening, and the front panel fastens and over the flat front or cover. Alternatively, the server case may comprise an opening in the front of the case, and the front panel fastens over the opening, thereby also serving as a cover.

In one embodiment, front panel comprises a lower edge that rests on a shelf on the case. The front panel may cover all or a portion of the front of the case. Two or more tabs with magnets extend from the sides of the front panel towards the back. The tabs align with and fit inside corresponding slots on the sides of the case. Tabs also may be used along the top or bottom of the panel. The top of the front panel is pivoted into place, ensuring that the upper and lower magnets are seated with the slots. To remove, the user grasps the front panel near the top, and firmly pulls to release the magnets. The lower edge can then be lifted out of the shelf on the enclosure.

In an alternative embodiment, the tabs may not use magnets, but may be secured through a friction fit, snap-fit, hook-and-loop strips, or the like. In another embodiment, the panel is installed directly, without the lower edge resting on a shelf on the case. In yet a further embodiment, no tabs are used, and magnets or other attachment means are installed on the back of the front panel. In an alternative embodiment, a single pair of tabs are used. Tabs also may extend over the sides of the case, and slots may not be necessary.

DETAILED DESCRIPTION OF EXEMPLARY EMBODIMENTS

In various exemplary embodiments, the present invention comprises a server case, chassis, or enclosure 10 with an easily removable front panel or plate 20. The outside (or front) of the front panel may be decorated with a logo, trademark, or other design 30, and thus be used by a vendor supplying a server case, with or without a computer or computer apparatus installed, as a means of decorating, identifying, or branding the case or contents, or both. In several embodiments, the panel also serves as a front cover for the server chassis or case, although the front panel or plate also may be placed on the front cover of the server chassis or case.

The front panels may come in a variety of configurations, designed to fit onto a variety of server cases, and are interchangeable for a particular type or size or server case. The server case generally comprises a flat front, with or without an opening, and the front panel fastens and over the flat front or cover. Alternatively, the server case may comprise an opening in the front of the case, and the front panel fastens over the opening, thereby also serving as a cover.

Figure 1:
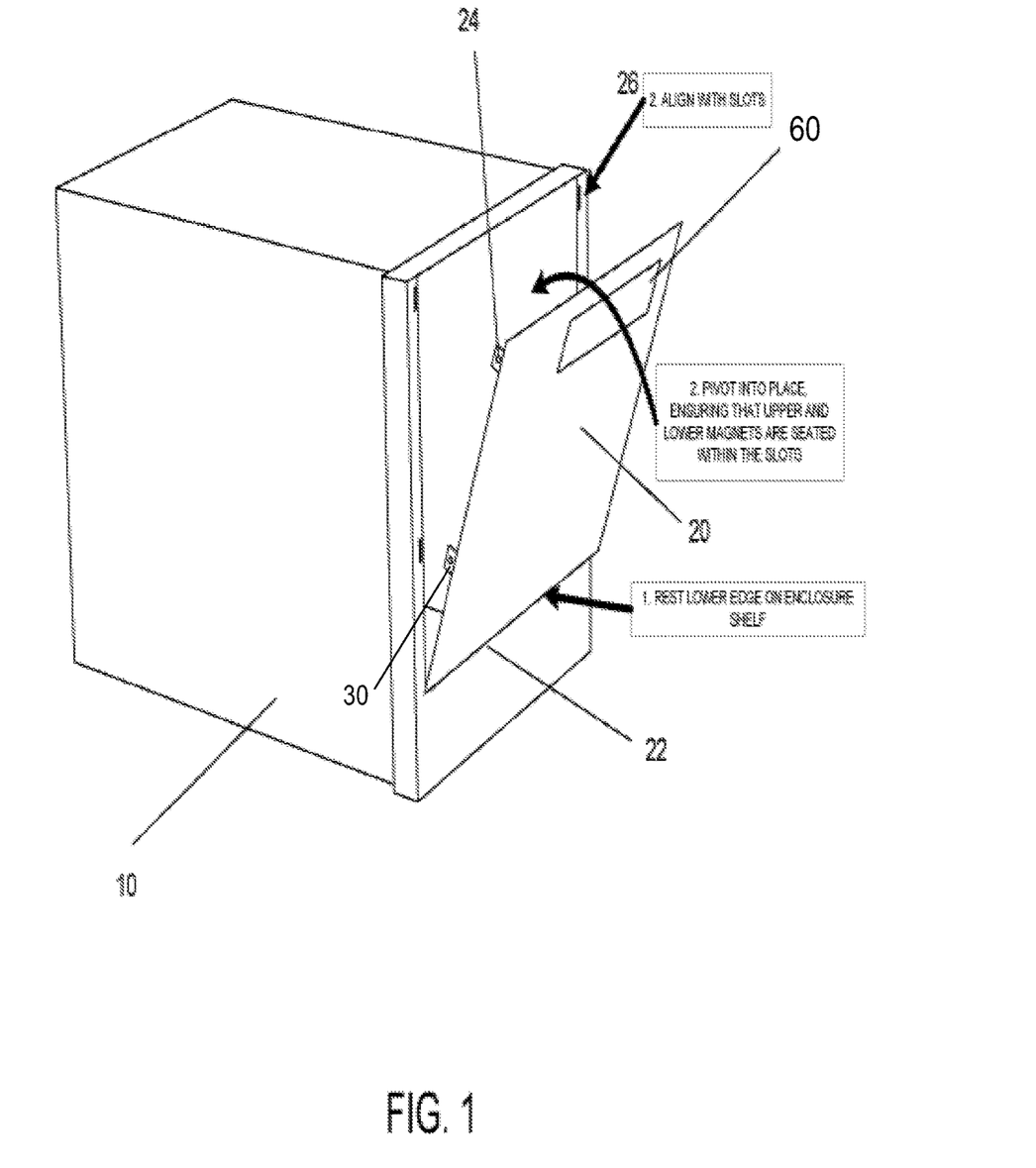
FIG. 1 shows a view of the steps of a front panel being installed on a server case, in accordance with an embodiment of the present invention.
Figure 3:
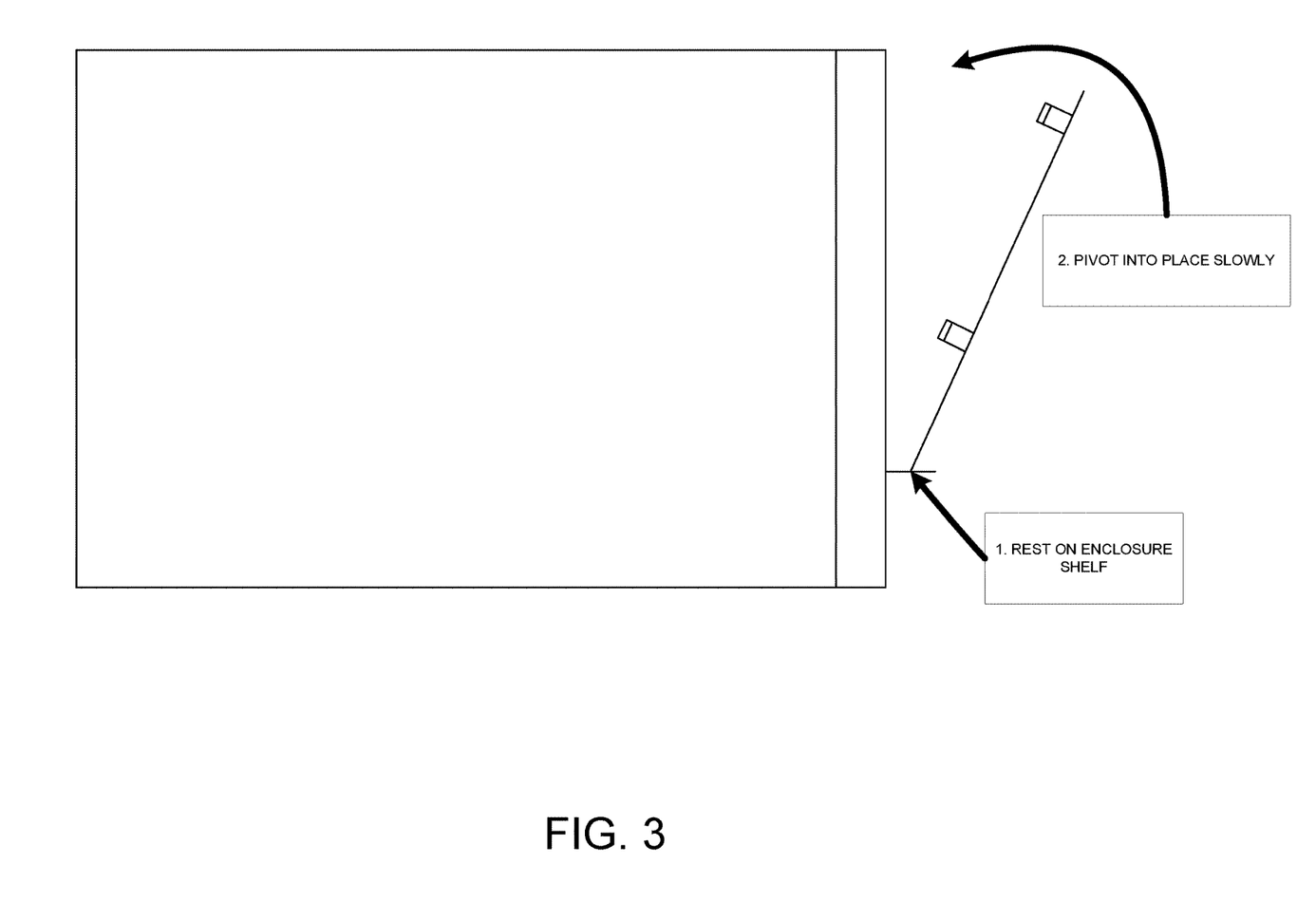
FIG. 3 shows a side view of FIG. 1.
Figure 4:
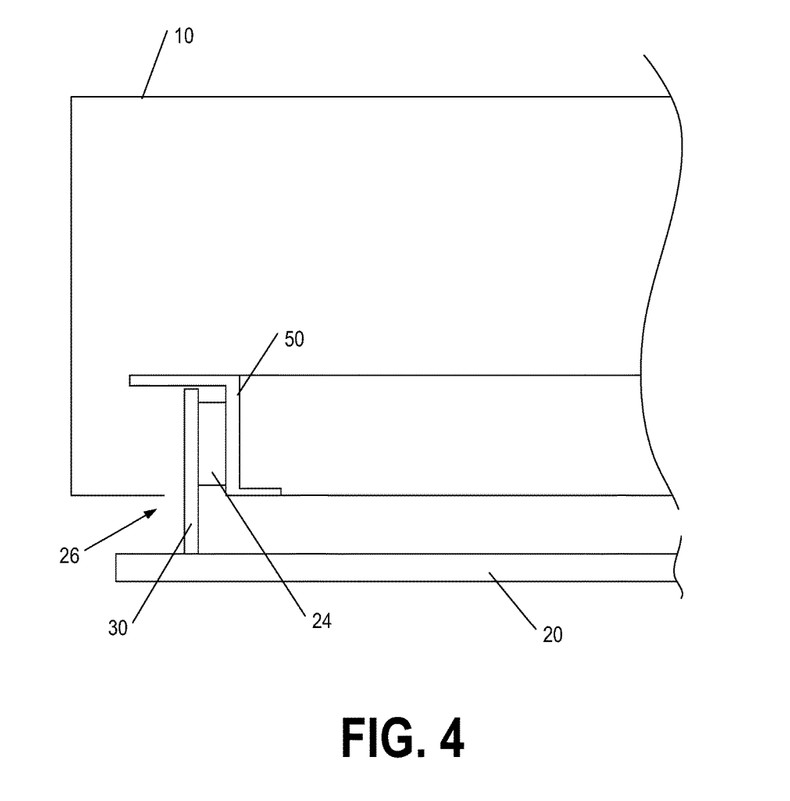
FIGS. 4-13 shows various views of a front panel on a server case.
Figure 5:
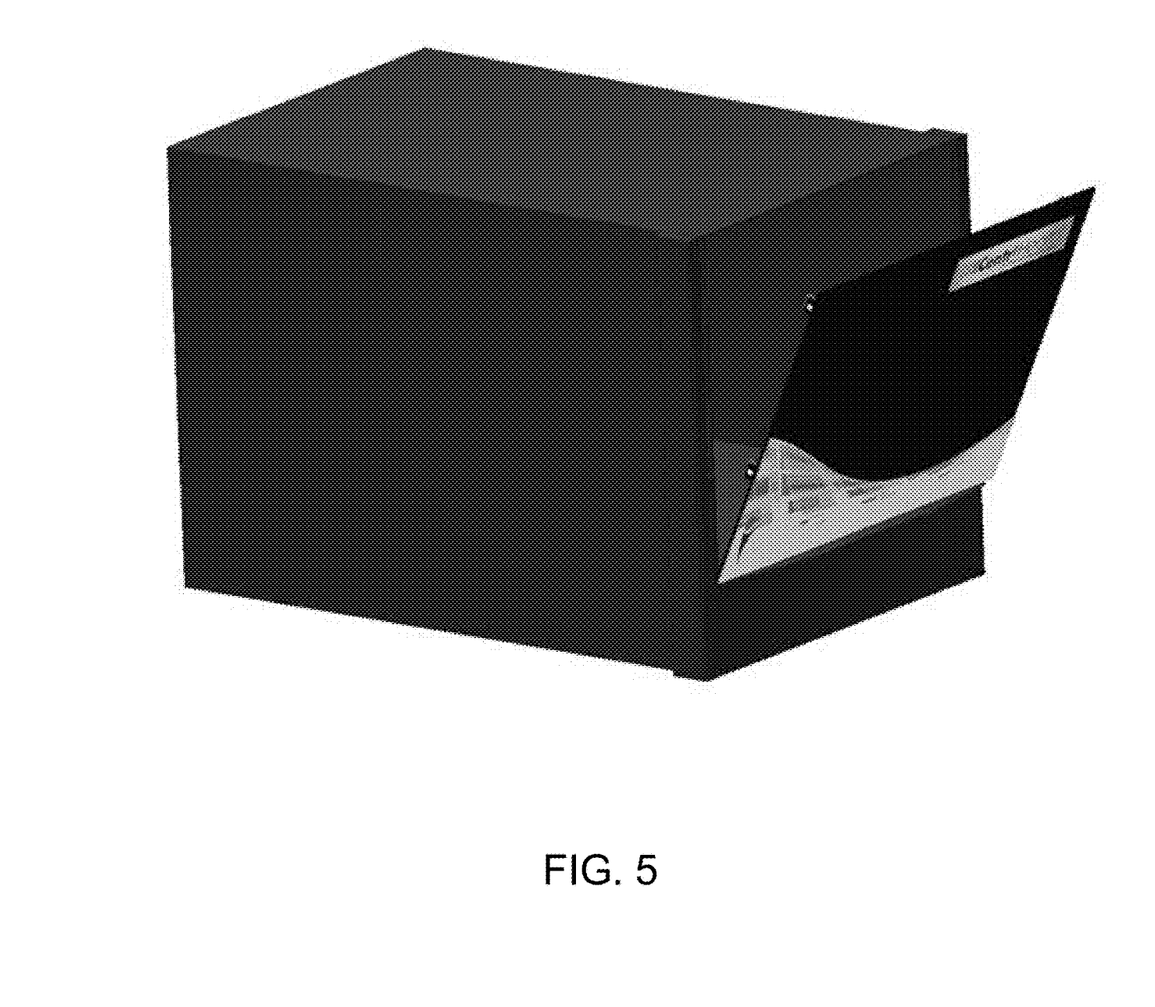
Figure 6:
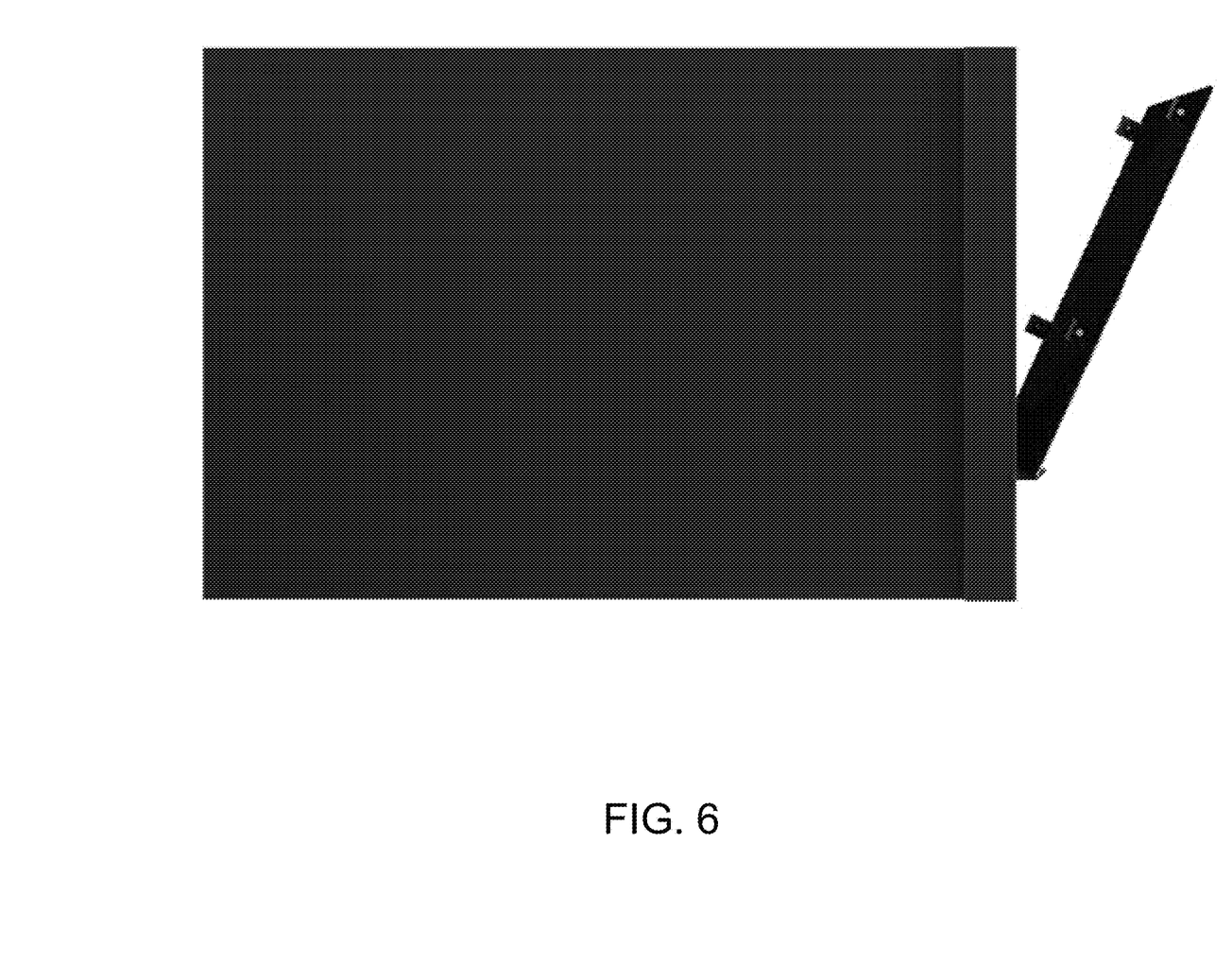
Figure 7:
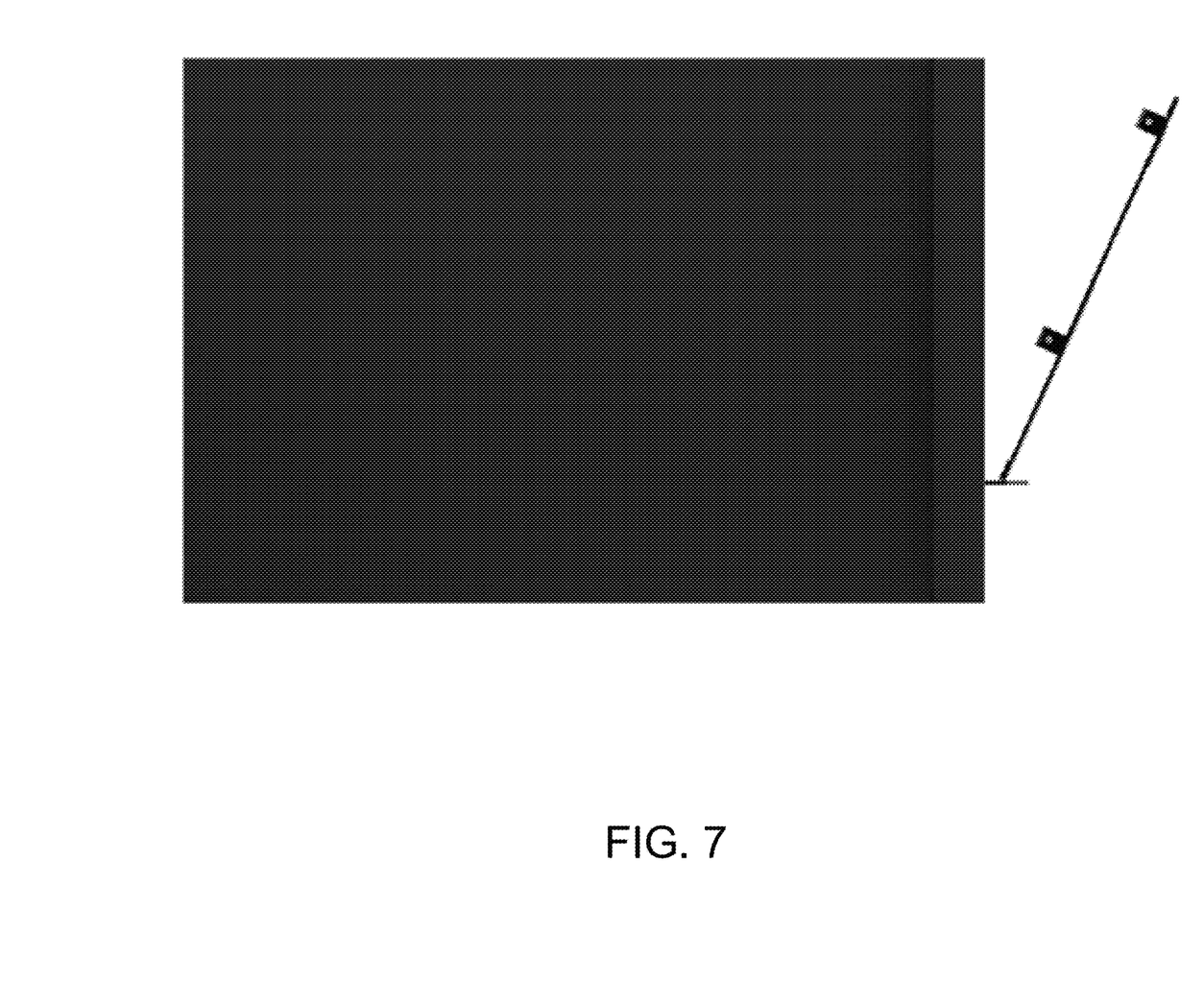
Figure 8:
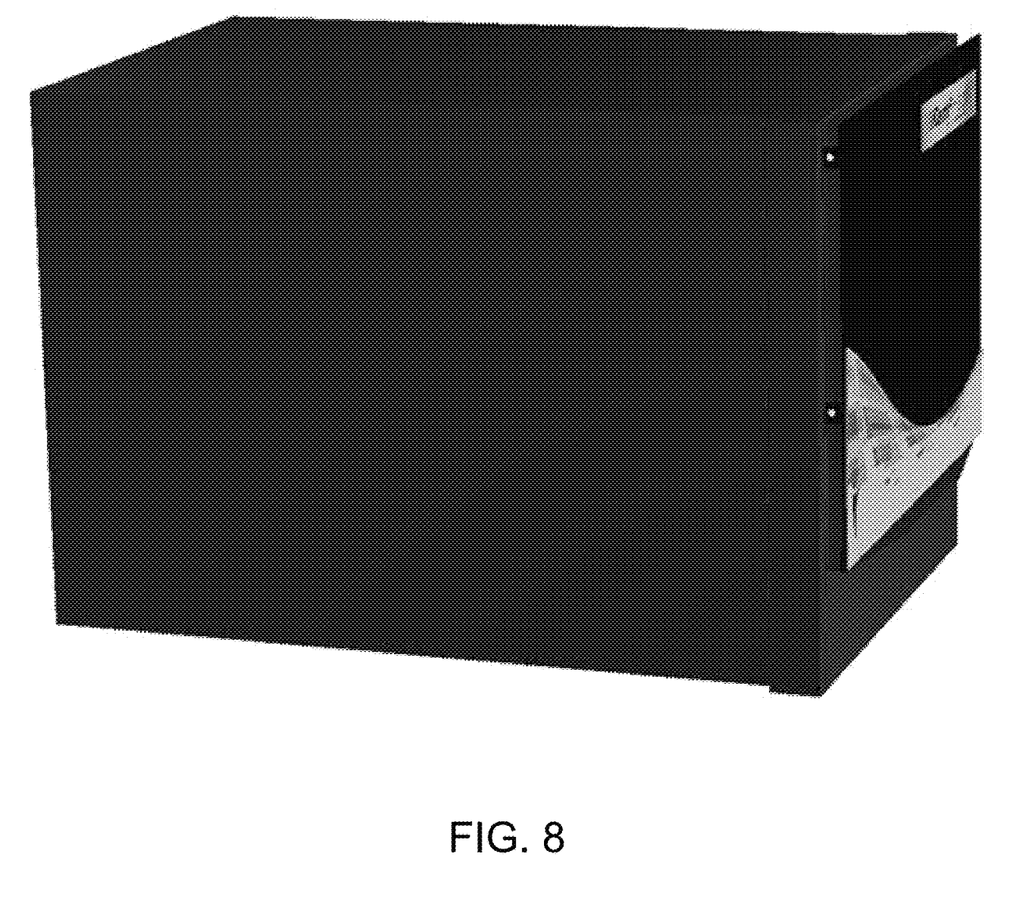
Figure 9:
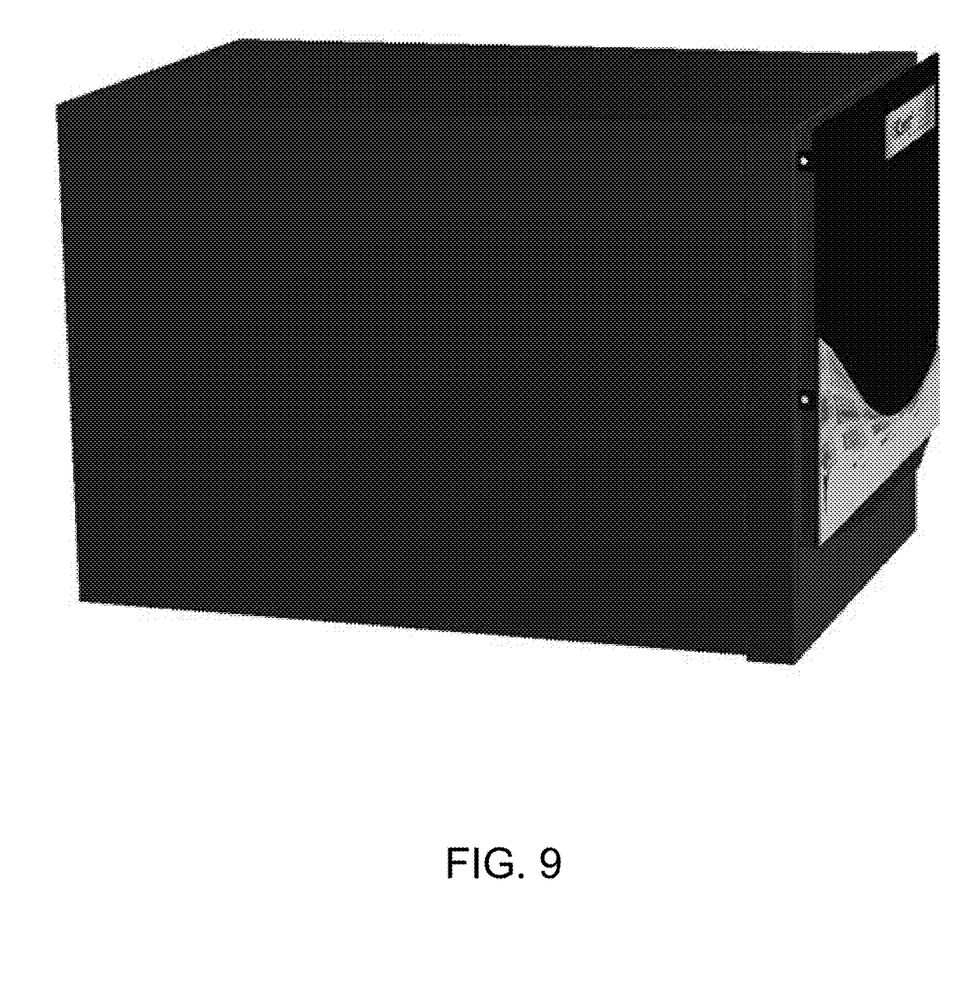
Figure 10:
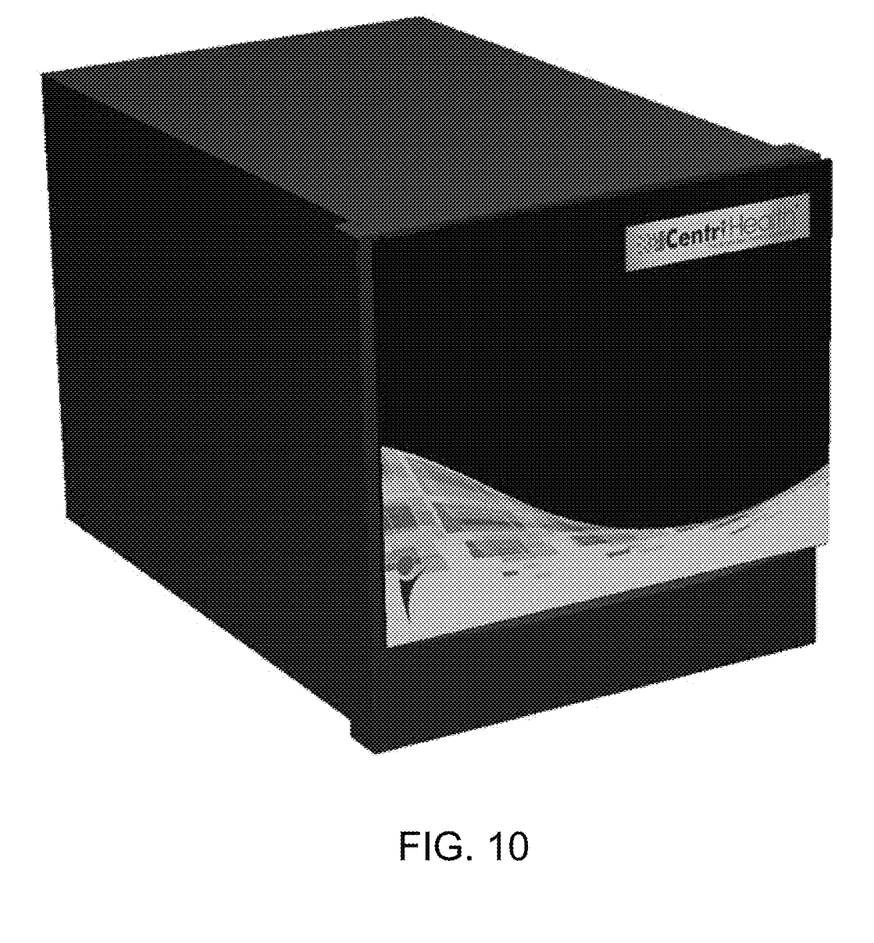
Figure 11:
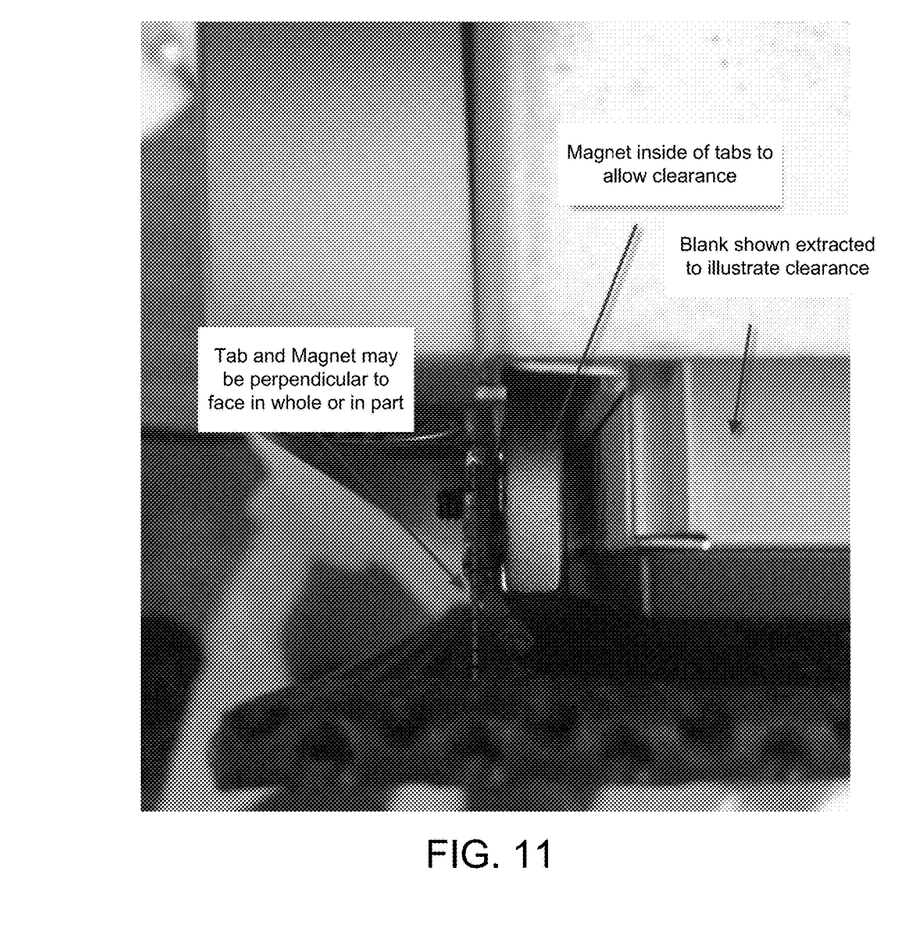
Figure 12:
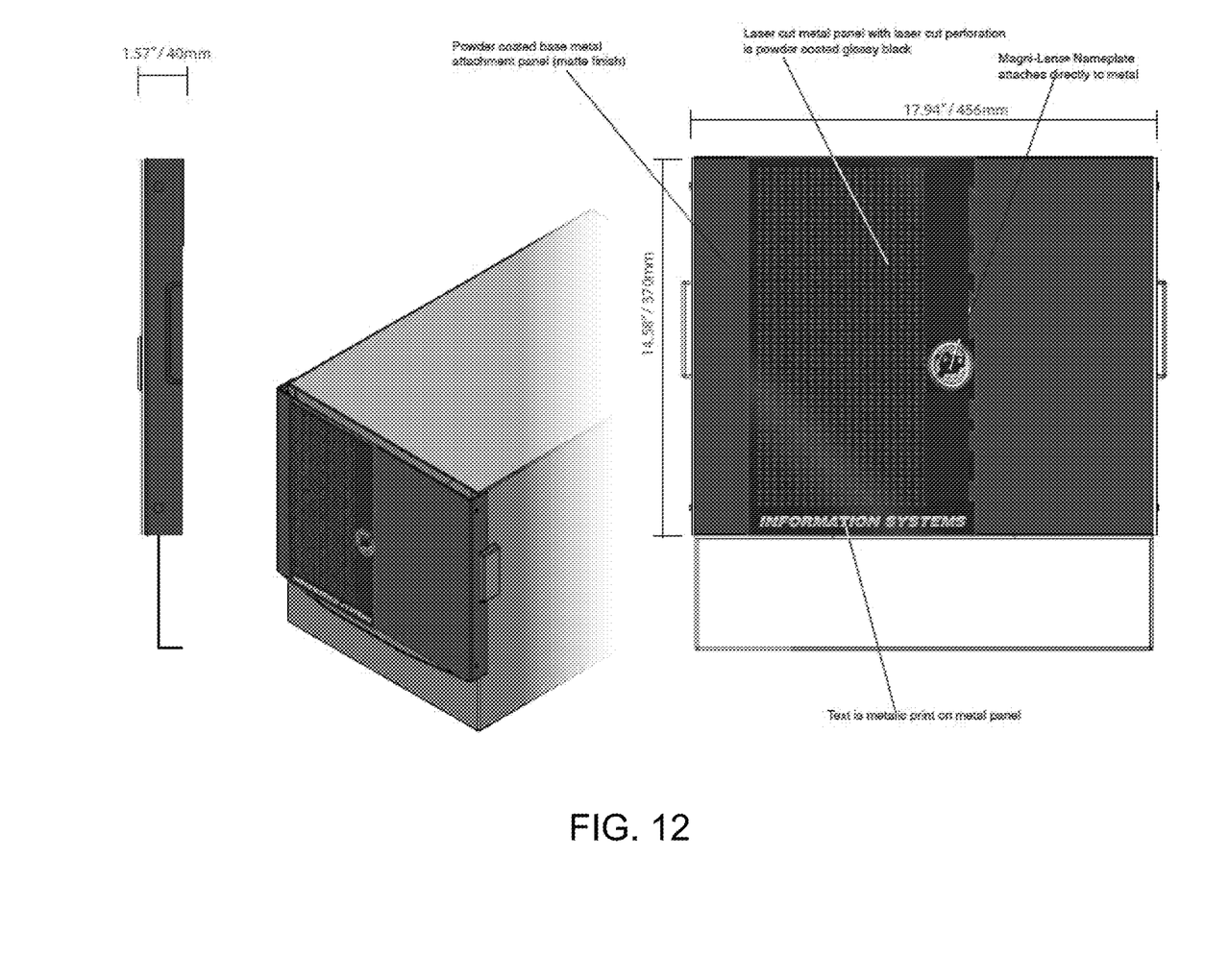
Figure 13:
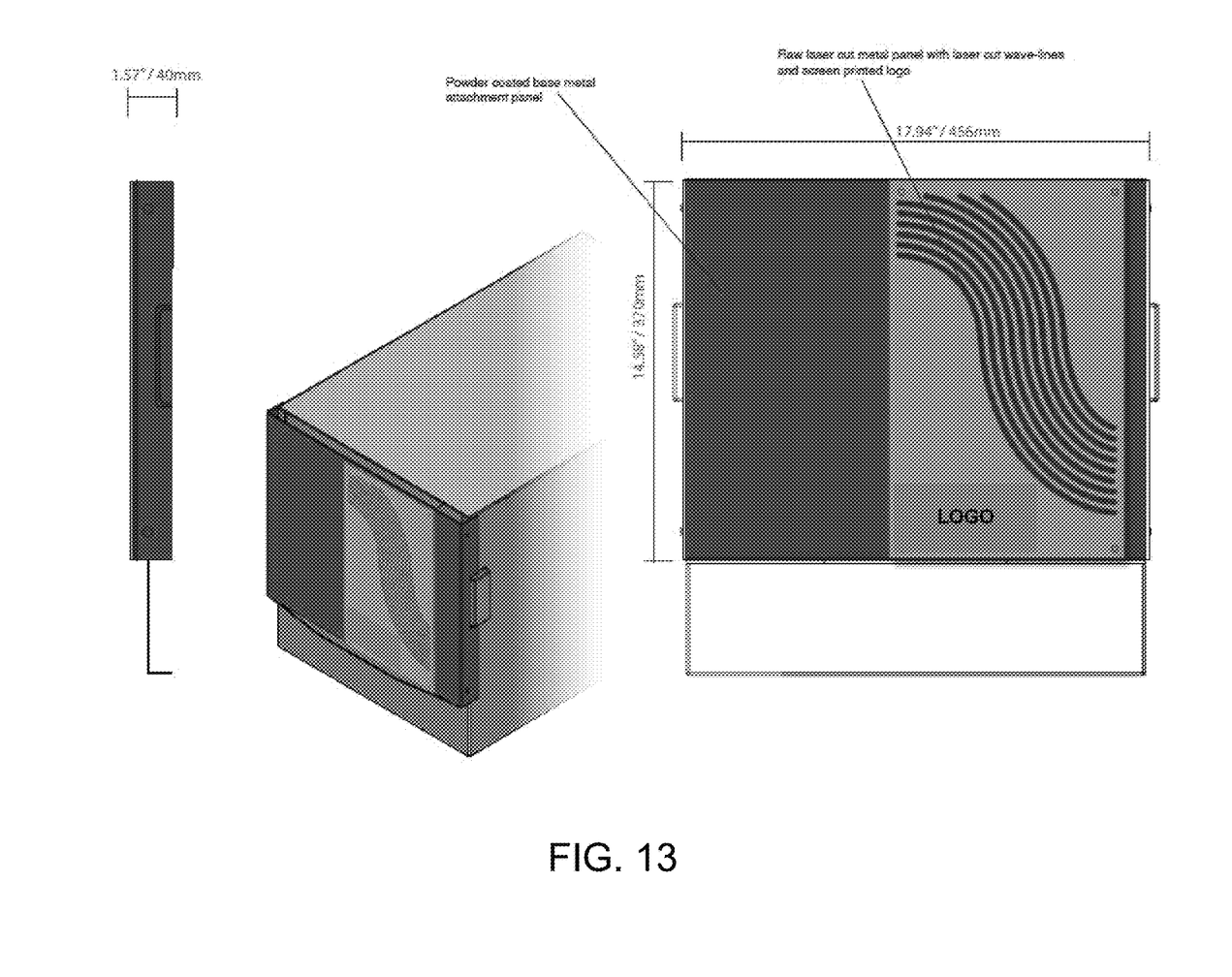

In the embodiment shown in FIGS. 1 and 3, the front panel comprises a lower edge 22 that rests on a shelf on the front of the case. The front panel may cover all or a portion of the front of the case. Two or more tabs 30 with magnets 24 extend from the sides of the front panel towards the back. The tabs 30 align with and fit inside corresponding slots 26 on the sides of the case. Tabs also may be used along the top or bottom of the panel. The top of the front panel is pivoted into place, ensuring that the upper and lower magnets are seated with the slots.

While the front panel could be mounted with magnets mounted flat on the back of the panel to attach to a metal front or frame of the case, this may allow the panel to be accidentally moved on the front of the case (i.e., become misaligned) or knocked off. Further, the front of the case may not be metal or expose the metal frame. The combination of the tabs with magnets resolves these problems. The magnets hold the front panel in place by attachment to the metal frame (accessible through the slots), with the tabs ensuring that the panel cannot be accidentally moved laterally in any direction relative to the front of the case (i.e., misaligned) or knocked off.

Figure 2:
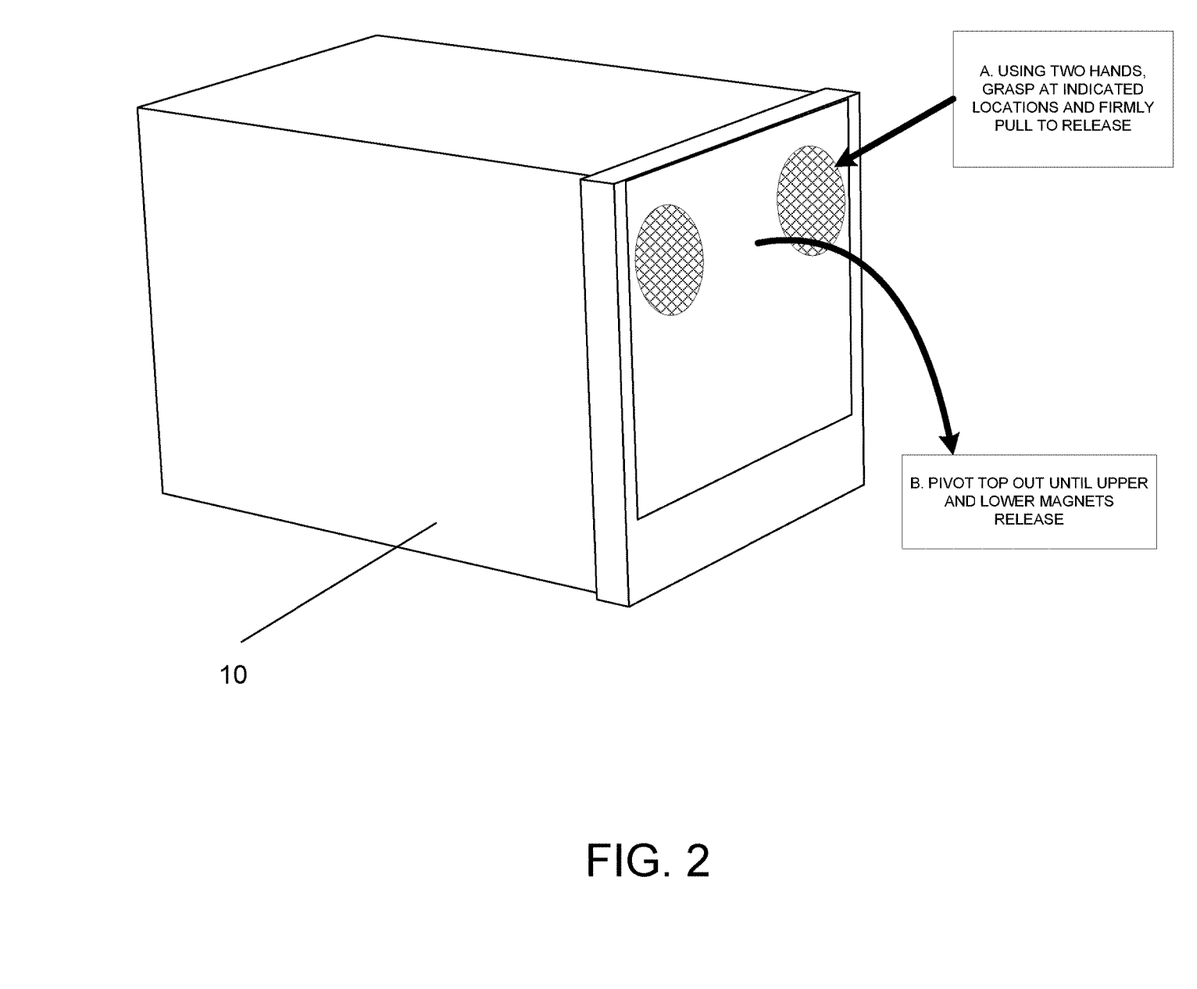
FIG. 2 shows a view of the steps of a front panel being removed from a server case.

To remove the panel, the user grasps the front panel near the top, and firmly pulls to release the magnets, as seen in FIG. 2. The lower edge can then be lifted out of the shelf on the enclosure. The panel thus is easily installed and removed by hand without the use of tools.

In an alternative embodiment, the tabs may not use magnets, but may be secured through a friction fit, snap-fit, hook-and-loop strips, or the like. In another embodiment, the panel is installed directly, without the lower edge resting on a shelf on the case. In yet a further embodiment, no tabs are used, and magnets or other attachment means are installed on the back of the front panel. In an alternative embodiment, a single pair of tabs are used. In some exemplary embodiments, tabs may extend over the sides of the case, and slots may not be necessary.

The magnets may be located on the inside or the outside of the tabs (which extend toward the back of the panel at substantially at or close to a right angle), or both. The end of the tab may be enclosed or covered by a magnet. The end of the tab itself may be a magnet or magnetized, in whole or in part.

Thus, it should be understood that the embodiments and examples described herein have been chosen and described in order to best illustrate the principles of the invention and its practical applications to thereby enable one of ordinary skill in the art to best utilize the invention in various embodiments and with various modifications as are suited for particular uses contemplated. Even though specific embodiments of this invention have been described, they are not to be taken as exhaustive. There are several variations that will be apparent to those skilled in the art.

What is claimed is:

1. An apparatus, comprising:
    a computer server case with a front with a plurality of slots, wherein the computer server cases comprises a metal internal chassis adjacent each of the plurality of slots; and
    a flat removable plate with a top edge, a bottom edge, a right edge and a left edge with a plurality of tabs extending from the right edge and left edge at substantially a right angle with respect to the flat plate, each of said plurality of tabs comprising at least one magnet, said tabs with magnets adapted to fit within said plurality of slots, whereby the removable plate is secured in place by magnetic force between the magnets positioned within said plurality of slots and the adjacent metal internal chassis,
    wherein the flat removable plate rests on an enclosure shelf extending from the front of the computer server case,
    wherein the flat removable plate is pivotable into a seated arrangement in which the tabs fit within said plurality of slots,
    wherein the flat removable plate is removable by:
        removing the magnets from within said plurality of slots, and
        lifting the bottom edge of the flat removable plate out of the enclosure shelf.

2. The apparatus of claim 1, wherein the removable plate comprises a front side and a back side, and the plurality of tabs extend at substantially a right angle from the right and left edges towards the back of the removable plate.

3. The apparatus of claim 2, wherein some or all of the front side of the plate comprises markings with one or more of the following: a logo, image, text, or symbols.

4. The apparatus of claim 3, wherein the markings are printed or engraved on the front side of the plate.

5. The apparatus of claim 1, wherein the magnet on each tab is located on the inside of each tab.

6. The apparatus of claim 1, wherein the magnet on each tab is located on the outside of each tab.

7. The apparatus of claim 1, wherein each tab comprises a first magnet on the inside of the tab and a second magnet on the outside of the tab.

8. The apparatus of claim 1, wherein the end of the tab is covered by a magnet.

9. The apparatus of claim 1, wherein some or all of the tab is magnetized.

10. A system for interchanging face plates on a server case or chassis, comprising:
    a computer server cases with a front with a plurality of slots, wherein the computer server cases comprises a metal internal chassis adjacent each of the plurality of slots; and
    a plurality of interchangeable and removable flat plates, each of the plurality of flat plates having a top edge, a bottom edge, a right edge and a left edge, each flat plate with a plurality of tabs with magnets, said plurality of tabs extending from the right edge and left edge at substantially a right angle with respect to a respective flat plate, said plurality of tabs with magnets adapted to fit within said plurality of slots, whereby the plate is secured in place by magnetic force between the magnets positioned within said plurality of slots and the adjacent metal internal chassis;
    wherein the flat removable plate rests on an enclosure shelf extending from the front of the computer server case,
    wherein the flat removable plate is pivotable into a seated arrangement in which the tabs fit within said plurality of slots,
    wherein the flat removable plate is removable by:
        removing the magnets from within said plurality of slots, and
        lifting the bottom edge of the flat removable plate out of the enclosure shelf.

* * * * *

UNITED STATES PATENT AND TRADEMARK OFFICE
CERTIFICATE OF CORRECTION

PATENT NO. : 10,034,404 B2
APPLICATION NO. : 14/937354
DATED : July 24, 2018
INVENTOR(S) : Ivkov et al.

Page 1 of 1

It is certified that error appears in the above-identified patent and that said Letters Patent is hereby corrected as shown below:

In the Claims

Column 4
Line 19, "cases" should read --case--

Signed and Sealed this
Thirteenth Day of November, 2018

Andrei Iancu
*Director of the United States Patent and Trademark Office*